United States Patent

Katscher et al.

(10) Patent No.: US 7,701,211 B2
(45) Date of Patent: Apr. 20, 2010

(54) MAGNETIC RESONANCE IMAGING SYSTEM AND METHOD

(75) Inventors: Ulrich Katscher, Norderstedt (DE);
Christian Findeklee, Norderstedt (DE);
Peter Vernickel, Hamburg (DE);
Christoph Leussler, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 362 days.

(21) Appl. No.: 11/721,544

(22) PCT Filed: Dec. 19, 2005

(86) PCT No.: PCT/IB2005/054312

§ 371 (c)(1),
(2), (4) Date: Jun. 13, 2007

(87) PCT Pub. No.: WO2006/067727

PCT Pub. Date: Jun. 29, 2006

(65) Prior Publication Data

US 2009/0251144 A1  Oct. 8, 2009

(30) Foreign Application Priority Data

Dec. 22, 2004  (EP)  ................................. 04106844

(51) Int. Cl.
*G01V 3/00* (2006.01)
(52) U.S. Cl. ....................................... 324/318; 324/322
(58) Field of Classification Search ................. 324/318, 324/322
See application file for complete search history.

(56) References Cited

U.S. PATENT DOCUMENTS 5,759,152 A   6/1998 Felmlee et al.

(Continued)

FOREIGN PATENT DOCUMENTS

EP   1279986 A2   1/2003

(Continued)

OTHER PUBLICATIONS

Ibrahim, T. S., et al.; Dielectric resonances and B1 field inhomogeneity in UHFMRI: computational analysis and experimental findings; 2001; Magnetic Resonance Imaging; 19:219-226.

(Continued)

*Primary Examiner*—Louis M Arana

(57) ABSTRACT

The present invention relates to a magnetic resonance imaging system (1) comprising a plurality of RF coils (4) forming a multi-coil array and furthermore to a magnetic resonance imaging method for such a system. In order to provide an MR imaging system and method in which a desired excitation pattern is achieved in a simple way, it is suggested to utilize an analytical procedure how to combine the single coil elements to obtain the most homogeneous B1 excitation possible with a given coil array. In other words, the homogeneity of the B1 field is improved in a very simple way. The sensitivity of each RF coil (4) of the coil array is scaled or weighted by a complex factor, i.e. phase and amplitude of each coil drive signal is adjusted accordingly. These complex factors are determined analytically utilizing the sensitivities S(8) of the coil elements (4) and the desired excitation pattern P (IO, 11). The invention allows an optimized control of the field distribution (RF shimming) for arbitrary RF coil arrays. With the invention a fast and easy independent phase and amplitude control of the coil elements (4) is provided for reducing body-induced RF non-uniformities, which appear in high field MR systems.

10 Claims, 2 Drawing Sheets

U.S. PATENT DOCUMENTS

| | | | |
|---|---|---|---|
| 7,183,770 B2 * | 2/2007 | Graβlin et al. | 324/322 |
| 7,259,562 B2 * | 8/2007 | Wang et al. | 324/318 |
| 7,439,742 B2 * | 10/2008 | Fontius et al. | 324/318 |
| 7,508,214 B2 * | 3/2009 | Misic | 324/322 |
| 2004/0155656 A1 | 8/2004 | Leussler | |

FOREIGN PATENT DOCUMENTS

| | | |
|---|---|---|
| WO | 2004053514 A1 | 6/2004 |

OTHER PUBLICATIONS

Katscher, U., et al.; Theory and experimental verification of transmit SENSE; 2002; Proc. Int'l. Soc. Mag. Reson. Med.; 10:189.

Katscher, U., et al.; Correspondence-Theoretical and Numerical Aspects of Transmit SENSE; 2004: IEEE Trans. on Medical Imaging; 23(4)520-525.

Katscher, U., et al.; Transmit SENSE; 2003; Magnetic Resonance in Medicine; 49:144-150.

Ledden, P.; Transmit Homogeneity at High Fields: Computational Effects of "B1 Shimming" with an Eight Element Volume Coil; 2003; Proc. Intl. Soc. Mag. Reson. Med.;11:2390.

Zhu, Y.; Acceleration of Focused Excitation with a Transmit Coil Array; 2002; Proc. Int'l. Soc. Mag. Reson. Med.; 10.

* cited by examiner

MAGNETIC RESONANCE IMAGING SYSTEM AND METHOD

The present invention relates to a magnetic resonance imaging system comprising a plurality of RF coils forming a multi-coil array. Furthermore the present invention relates to a magnetic resonance imaging method for such a system and to a computer program.

In the magnetic resonance (MR) imaging technique, proton spins of a body under examination, for example a human body, are excited by means of a high frequency B1 magnetic field. The frequency of the B1 field depends on the strength of the static magnetic field $B_0$ and is in the radio frequency (RF) range. After excitation, the spins return to their equilibrium state and in this process they transmit an electromagnetic signal, which is called a free induction decay. This signal can be received and MR images derived therefrom. This MR imaging technique is well known in the prior art.

Recently high-field MR systems with multi-element RF coil arrays have been introduced for improved MR imaging. Thereby the multi-element RF coil array is based on a setup of single RF coil elements. It is necessary to control the B1 field homogeneity in the imaging sequence so as to compensate for varying effects on the field distribution which are due, for example, to the different dielectric properties of the body to be examined. In order to achieve a defined (e.g. homogeneous) B1 excitation with a given coil array, the single coil elements have to be combined in a certain way. In the prior art this has been done using a trial-and-error approach.

In WO 2004/053514 A1 an MR imaging system with a plurality of transmit coils is described, wherein individual coil drive signals are provided to improve the homogeneity of the B1 field. Thereby it is suggested to use individual weighting factors for each coil, i.e. to individually set the amplitude and/or phase of each coil drive signals (RF shimming). However, no instruction is given how to adjust amplitude or phase.

It is therefore an object of the present invention to provide an MR imaging system and method in which a desired B1 field is obtained in a fast and easy way.

This object is achieved according to the invention by a magnetic resonance imaging system, comprising a plurality of RF coils forming a multi-coil array, a coil drive device for generating a plurality of individual coil drive signals, a control device for individually setting the amplitude and/or phase of each of said coil drive signals according to a weighting factor, and a weighting device for determining the weighting factors for a number of RF coils by measuring the sensitivities of said RF coils and calculating the weighting factors for a given excitation pattern.

The object of the present invention is also achieved by a magnetic resonance imaging method for operating a magnetic resonance imaging system comprising a plurality of RF coils forming a multi-coil array, the method comprising the steps of determining weighting factors for a number of RF coils by measuring the sensitivities of said RF coils and calculating the weighting factors for a given excitation pattern, generating a plurality of individual coil drive signals, and individually setting the amplitude and/or phase of each of said coil drive signals according to a weighting factor.

The object of the present invention is also achieved by a computer program comprising computer instructions to determine weighting factors for a number of RF coils by measuring the sensitivities of said RF coils and calculating the weighting factors for a given excitation pattern and computer instructions to individually set the amplitude and/or phase of each of a plurality of individual coil drive signals according to a weighting factor, when the computer instructions are carried out in a computer. The technical effects necessary according to the invention can thus be realized on the basis of the instructions of the computer program in accordance with the invention. Such a computer program can be stored on a carrier or it can be available over the internet or another computer network. Prior to executing, the computer program is loaded into a computer by reading the computer program from the carrier, for example by means of a CD-ROM player, or from the internet, and storing it in the memory of the computer. The computer includes inter alia a central processor unit (CPU), a bus system, memory means, e.g. RAM or ROM etc. and input/output units.

The invention is based upon the idea to utilize an analytical procedure how to combine the single coil elements to obtain the desired B1 pattern (e.g. most homogeneous B1 excitation possible with a given coil array). In other words, the homogeneity of the B1 field is improved in a very fast and easy way. The sensitivity of each RF coil of the coil array is scaled or weighted by a complex factor, i.e. phase and amplitude of each coil drive signal is adjusted according to this complex factor. According to the invention, these complex factors are determined analytically utilizing the sensitivities of the coil elements and the desired excitation pattern. The invention allows an optimized control of the field distribution (RF shimming) for arbitrary RF coil arrays. With the invention a fast and easy independent phase and amplitude control of the coil elements is provided for reducing body-induced RF non-uniformities, which appear in high field MR systems.

These and other aspects of the invention will be further elaborated on the basis of the following embodiments, which are defined in the dependent claims.

In a preferred embodiment of the invention the weighting device is adapted to calculate the weighting factors according to the equation given in claim 2. Assuming a linear relation between the complex weighting factors $U_r$ and the sensitivities $S_r(x)$ of R RF coil elements, the finally excited pattern $P(x)$ is estimated by $$P(x) = \sum_{r=1}^{R} S_r(x) U_r. \tag{1}$$

Discretizing P and $S_r$ on N spatial points (e.g. a Cartesian $\sqrt{N} \times \sqrt{N}$ grid), this equation can be converted to a matrix-vector multiplication, which eliminates the sum over R $$\underline{P} = \underline{\underline{S}}\, \underline{U}. \tag{2}$$

The matrix $\underline{\underline{S}}$ can be split in a product $\underline{\underline{S}} = \underline{\underline{S'}}\,\underline{\underline{Y}}$. $\underline{\underline{S'}}$ denote the sensitivities of the coils disregarding coupling. Multiplying the admittance matrix $\underline{\underline{Y}}$ with $\underline{U}$ yields the coil currents resulting from the coupling. Thus, equation (2) can be rewritten $$\underline{P} = \underline{\underline{S'}}\,\underline{\underline{Y}}\,\underline{U}, \tag{3}$$

whereas equation (3) can also be written as $$\prod_{N}\begin{pmatrix}\underline{P}\end{pmatrix} = \prod_{N}\begin{pmatrix}\underline{\underline{S'}}\end{pmatrix}_{R}\begin{pmatrix}\underline{\underline{Y}}\end{pmatrix}_{R}\begin{pmatrix}\underline{U}\end{pmatrix}_{R}$$

Since the problem is expected to be ill-conditioned, regularization is be applied to solve equation (2) according to $$\underline{U} = (\underline{\underline{S}}^H \underline{\underline{S}} + \lambda^2)^{-1} \underline{\underline{S}}^H \underline{P}. \tag{4}$$

Therein $\lambda$ is used as a freely adjustable regularization parameter. The superscript H denotes the transposed complex conjugate of the concerned matrix. Thus, assuming a desired excitation pattern $\underline{P}$, which usually is a homogeneous field of excitation, and filling $\underline{\underline{S}}$ with data measured in advance, the optimal weighting factors $\underline{U}$ for the R coils can be calculated in an analytical, thus fast and easy way via equation (4). From the complex weighting factors $\underline{U}$ amplitude and phase of the coil drive signals are obtained in a known way, wherein the modulus of the complex factor correspond to the amplitude of the coil drive signal and the phase of the complex factor correspond to the phase of the coil drive signal.

In another preferred embodiment of the invention the weighting device is adapted to determine the weighting factors in real time during the MR scan. This is of advantage in cases where the coil coupling and thus the coil sensitivities vary during the measurement. This might happen, e.g., due to respiratory motion, especially while scanning high-volume patients, or in a moving table scan. In such cases, the above-described embodiment enables a real-time RF shimming during the scan.

These and other aspects of the invention will be described in detail hereinafter, by way of example, with reference to the following embodiments and the accompanying drawings; in which.

Figure 1:
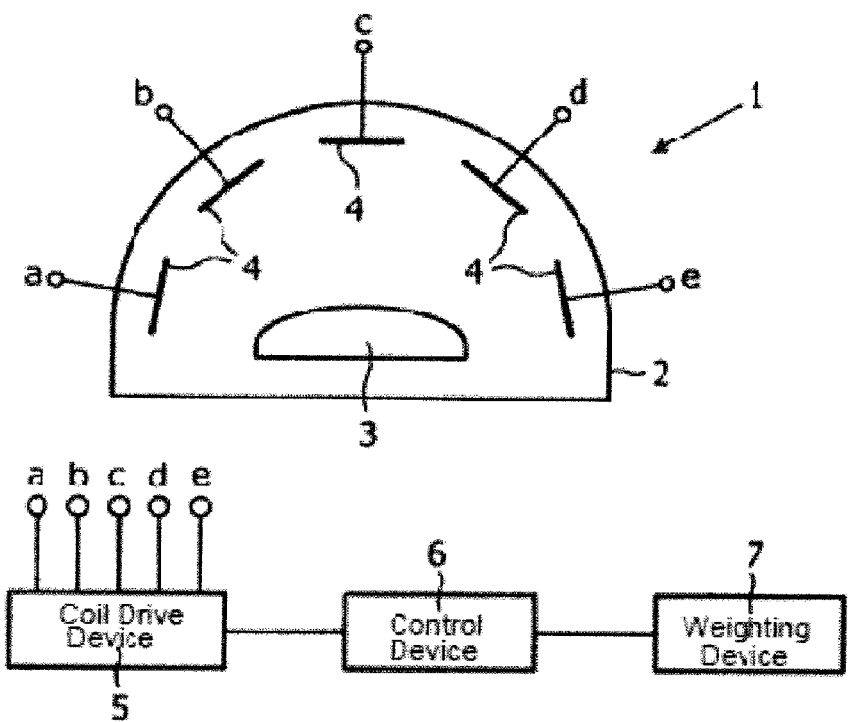
FIG. 1 shows schematically an MR system according to the present invention.

In FIG. 1 an MR imaging system 1 with the transmission arrangement is illustrated. The receiving arrangement of the system 1 including the control and processing devices to reconstruct the MR image are not shown. The MR imaging system 1 comprises a device to generate a static magnetic field $B_0$ and a magnetic gradient system 2 in which a body 3 under examination is placed. A number of transmit coils 4 is arranged within a magnet bore to built a multi-coil array. Instead of the transmit coils 4 a number of transmit receive coils can be used. One of the major applications of such arrays is to compensate for the dielectric resonances occurring in human tissue at high frequencies, leading to strong signal modulations in the reconstructed image. A coil drive device 5 for generating and amplifying a plurality of individual coil drive signals is connected to the number of transmit coils 4 via terminals, which are denoted by corresponding letters "a" to "e". The coil drive device 5 is connected to a control device 6 for individually setting the amplitude and phase of each of said coil drive signals according to a weighting factor $\underline{U}$. A weighting device 7 is connected to the control device 6. The weighting device 7 is adapted to determine the weighting factors $\underline{U}$ for each transmit coil by measuring the transmit sensitivities S of the transmit coils 4 and calculating the weighting factors $\underline{U}$ for a given excitation pattern P. For calculating the weighting factors $\underline{U}$ the weighting device 7 comprises a computer.

In a first step, the sensitivities S are measured, e.g. by a short measurement prior to the actual MR scan. The sensitivities S are stored in the weighting device 7 for further processing. After determining the sensitivities S an excitation pattern P is entered into the weighting device 7 by an operator. Typically, the excitation pattern P is homogeneous or adapted to the application-defined region of interest. Alternatively the excitation pattern P is selected from a number of given excitation pattern by an operator or even selected automatically by the weighting device 7. In a next step the weighting factors $\underline{U}$ are determined by the weighting device 7 using the equation (4) as described above. The complex weighting factors $\underline{U}$ are interpreted by the control device 6 as amplitude and phase of the coil drive signals for the transmit coils 4. Accordingly the control device 6 individually set the amplitude and phase of each coil drive signal according to the weighting factor $\underline{U}$. These coil drive signals are provided to the transmit coils 4 by the coil drive device 5. As a result the homogeneity of the overall B1 field is substantially improved or the desired excitation pattern is achieved as good as possible.

Figure 2:
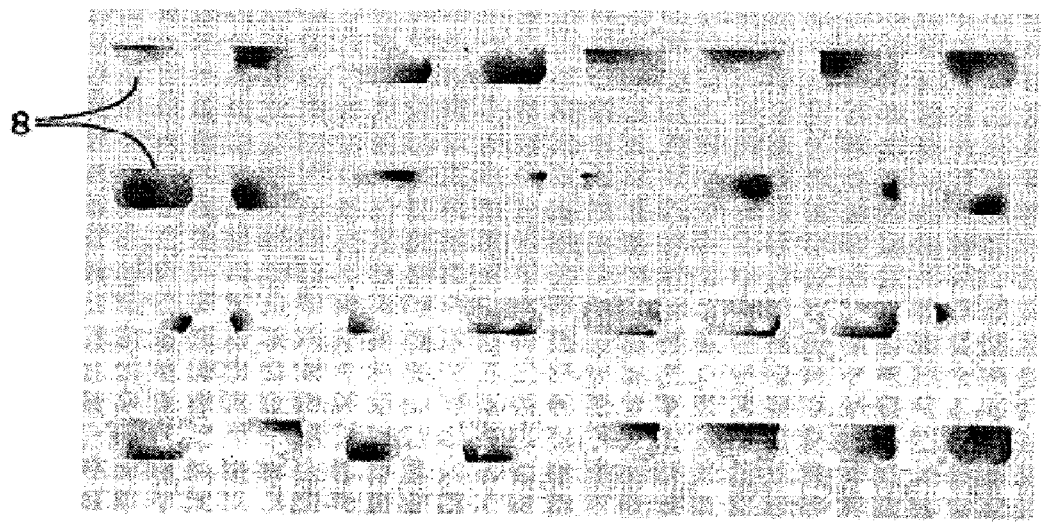
FIG. 2 shows transmit coil sensitivities taken from a 32 element receive array.
Figure 3:
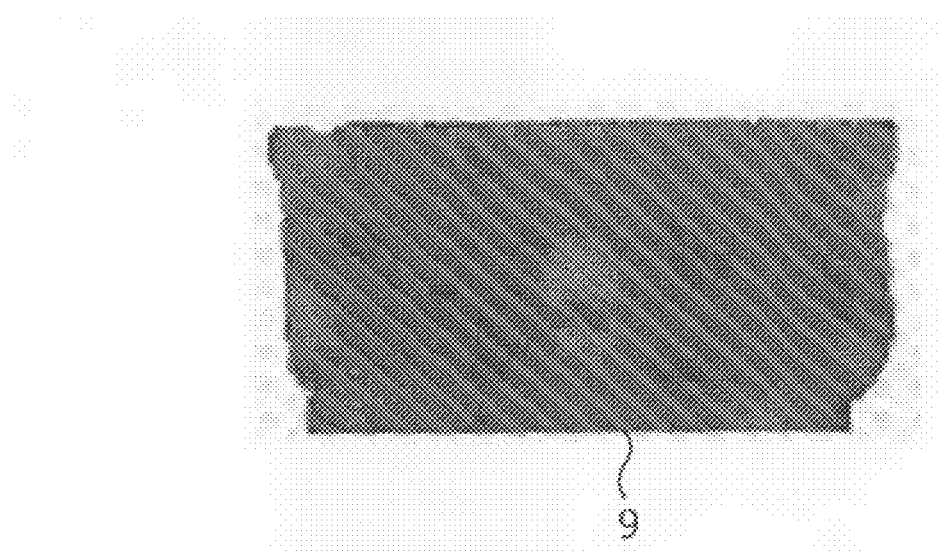
FIG. 3 shows a calculated result using all 32 coil elements shown in FIG. 1.

Tests have been carried out in order to verify the applicability of equation (4). In a first test a simulated 32 element receive array was used. The coil sensitivities have been taken from all 32 coil elements, measured as coronal slices at the abdomen of a human body at 1,5 T. FIG. 2 illustrates these coil sensitivities 8. Subsequently the weighting factors $\underline{U}$ have been calculated using equation (4). In a next step, a measurement was simulated using equation (1), yielding $P_{meas}(x)$. The mean difference between the desired excitation pattern $P(x)$ and the simulated $P_{meas}(x)$ was used as benchmark for the quality of the method. Using all 32 coil elements, $P_{meas}(x)$ showed a mean difference of 5.3% aiming a homogeneous field of excitation. The simulation result of the excitation pattern 9 is shown in FIG. 3.

Another test was carried out in order to find out, how many of the 32 coils are necessary to get a satisfying result. For this purpose a further simulation has been performed using not all 32 coils but in a first test only the most homogeneous coils and in a second test only the most "important" coils, i.e. the coils with the highest weighting factors $U_r$ obtained in the above-described simulation using all 32 coils. For R>3, the most "important" coils show better homogeneity than the most homogeneous coils. For R=4, the mean difference falls below 20%. For R=12, the mean difference falls below 10%.

Figure 4:
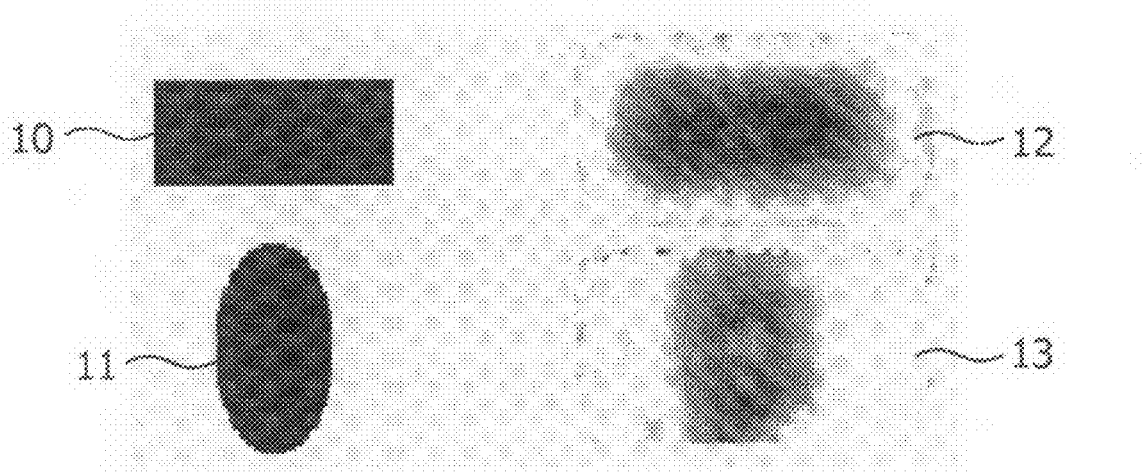
FIG. 4 shows results for different excitation patterns.

In another test different excitation patterns have been tested. The mean difference between $P(x)$ and $P_{meas}(x)$ was 0.242 for a rectangle and 0.274 for a circle. Thus, the excitation of these patterns is more difficult for the taken sensitivities than the excitation of a homogeneous field of excitation (mean difference 0.053). FIG. 4 show results for different excitation patterns, whereas on the left hand side the desired excitation patterns 10, 11 and on the right hand side the reconstructed excitation patterns 12, 13 are shown.

It will be evident to those skilled in the art that the invention is not limited to the details of the foregoing illustrative embodiments, and that the present invention may be embodied in other specific forms without departing from the spirit or essential attributes thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein. It will furthermore be evident that the word "comprising" does not exclude other elements or steps, that the words "a" or "an" do not exclude a plurality, and that a single element, such as a computer system or another unit may fulfil the functions of several means recited in the claims. Any reference signs in the claims shall not be construed as limiting the claim concerned.

1. MR imaging system
2. gradient system
3. body
4. transmit coil
5. coil drive device
6. control device
7. weighting device
8. coil sensitivity
9. excitation pattern
10. desired rectangular pattern
11. desired circular pattern
12. reconstructed rectangular pattern
13. reconstructed circular pattern

The invention claimed is:

1. A magnetic resonance (MR) imaging system, comprising:
   a plurality of radiofrequency (RF) coils forming a multi-coil array;
   a coil drive device which generates a plurality of individual a coil drive signal for each RF coil;
   a control device which adjusts an amplitude and/or phase of each of the RF coil drive signals according to a complex weighting factor U; and
   a weighting device which determines the complex weighting factors U for a number of the of RF coils by measuring the sensitivities S of the RF coils and calculating the weighting factors U for a desired excitation pattern P adapted to an application-defined region of interest.

2. The MR imaging system according to claim 1, wherein the weighting device which calculates the complex weighting factors according to $$\underline{U} = (\underline{S}^H \underline{S} + \lambda^2)^{-1} \underline{S}^H \underline{P}$$

where λ is a regularization parameter and H denotes a transposed complex conjugate.

3. The MR imaging system according to claim 1, wherein the weighting device determines the complex weighting factors U in real time during a MR scan.

4. A method for operating a magnetic resonance (MR) imaging system, the MR system comprising a plurality of radiofrequency (RF) coils forming a multi-coil array, the method comprising:
   determining complex weighting factors U for at least one of the RF coils S of the RF coils and calculating the weighting factors U for a desired excitation pattern P adapted to an application-defined region of interest;
   generating a plurality of individual coil drive signals;
   adjusting the amplitude and/or phase of each of the RF coil drive signals according to the weighting factor U.

5. A computer readable medium which carries a computer program for controlling a processor for operating a magnetic resonance (MR) imaging system to perform the method of claim 4.

6. The method according to claim 4, wherein the complex weighting factors are determined according to:

$$\underline{U} = (\underline{S}^H \underline{S} + \lambda^2)^{31\ 1} \underline{S}^H \underline{P}$$

where λ is a regularization parameter and H denotes a transposed complex conjugate.

7. The system as claimed in claim 1, wherein the measured sensitivities S of the at least one RF coils are determined in real time during a MR scan.

8. The method according to claim 4, wherein the step of determining a weighting factor for the at least one RF coil is performed in real time during a MR scan.

9. The method according to claim 4, wherein the measured sensitivities S of the at least one RF coils are determined in real time during a MR scan.

10. A magnetic resonance (MR) imaging system, comprising:
    a plurality of radiofrequency (RF) coils which form a multi-coil array;
    a coil drive device which generates a coil drive signal for each RF coil, the coil drive signals together form an excitation pattern which causes the RF coils to generate an excitation field in an examination region;
    a weighting device which determines a complex weighting factor U based on a measured sensitivity profile S and a desired excitation pattern P for each RF coil;
    a control device which adjusts an amplitude and/or phase of the coil drive signals for a corresponding RF coil according to the corresponding complex weighting factor U; and
    wherein the complex weighting factor U is determined according to:

$$\underline{U} = (\underline{S}^H \underline{S} + \lambda^2)^{-1} \underline{S}^H \underline{P}$$

where U is vector containing complex weighting factors for R RF coils, S is a sensitivity profile matrix for R RF coils over N spatial points, λ is a regularization parameter, P is a vector of desired excitation patterns for N spatial points, and H denotes a transposed complex conjugate

* * * * *